(12) United States Patent
Ieiri et al.

(10) Patent No.: US 11,183,943 B2
(45) Date of Patent: Nov. 23, 2021

(54) SEMICONDUCTOR MODULE

(71) Applicant: SHINDENGEN ELECTRIC MANUFACTURING CO., LTD., Tokyo (JP)

(72) Inventors: Yoshihisa Ieiri, Hanno (JP); Yoshihiro Kamiyama, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 334 days.

(21) Appl. No.: 16/334,000

(22) PCT Filed: Jun. 8, 2018

(86) PCT No.: PCT/JP2018/022012
§ 371 (c)(1),
(2) Date: Mar. 15, 2019

(87) PCT Pub. No.: WO2019/234912
PCT Pub. Date: Dec. 12, 2019

(65) Prior Publication Data
US 2021/0167693 A1 Jun. 3, 2021

(51) Int. Cl.
*H05K 7/20* (2006.01)
*H02M 7/00* (2006.01)
(Continued)

(52) U.S. Cl.
CPC ......... *H02M 7/003* (2013.01); *H02M 7/5387* (2013.01); *H02P 27/06* (2013.01)

(58) Field of Classification Search
CPC ...... H02K 11/33; H02M 7/003; H02M 7/537; H02P 27/06
See application file for complete search history.

(56) References Cited

U.S. PATENT DOCUMENTS

2008/0203962 A1* 8/2008 Maeda .................... H02P 25/03
318/721
2012/0098366 A1* 4/2012 Yamasaki ............. H02K 5/225
310/72
(Continued)

FOREIGN PATENT DOCUMENTS

JP 2001-237369 A 8/2001
JP 2006-093255 A 4/2006
(Continued)

OTHER PUBLICATIONS

International Application No. PCT/JP2018/022012, International Search Report, dated Aug. 21, 2018.
(Continued)

*Primary Examiner* — Muhammad S Islam
(74) *Attorney, Agent, or Firm* — Marshall, Gerstein & Borun LLP

(57) ABSTRACT

A semiconductor module is configured to convert a direct current to a three-phase alternating current, and to supply the three-phase alternating current to a three-phase motor to drive the three-phase motor, wherein a first gap M1 between side surfaces of the first and the second central wiring lines, which side surfaces are close to each other and face each other, and a second gap M2 between side surfaces of the second and the third central wiring lines, which side surfaces are close to each other and face each other, are bent on the top surface of the substrate.

15 Claims, 4 Drawing Sheets

(51) Int. Cl.
*H02M 7/5387* (2007.01)
*H02P 27/06* (2006.01)

(56) References Cited

U.S. PATENT DOCUMENTS

| | | | |
|---|---|---|---|
| 2015/0023084 A1* | 1/2015 | Sato | H01L 25/072 363/132 |
| 2016/0351488 A1* | 12/2016 | Kamiyama | H01L 23/49811 |

FOREIGN PATENT DOCUMENTS

| | | |
|---|---|---|
| JP | 2011-029262 A | 2/2011 |
| JP | 2014-064377 A | 4/2014 |
| JP | 6062565 B1 | 1/2017 |
| WO | WO-2017/154198 A1 | 9/2017 |

OTHER PUBLICATIONS

International Application No. PCT/JP2018/022012, International Preliminary Report on Patentability, dated Dec. 17, 2020.
Chinese Patent Application No. 201880003170.1, Office Action, dated Apr. 2, 2021.

* cited by examiner

SEMICONDUCTOR MODULE

CROSS-REFERENCE TO RELATED APPLICATIONS

This application is the U.S. national phase of PCT Application No. PCT/JP2018/022012, filed on Jun. 8, 2018, the entire disclosure of which is hereby incorporated by reference in their entirety.

TECHNICAL FIELD

The present invention relates to semiconductor modules.

BACKGROUND ART

A semiconductor module that converts DC power inputted from a DC power supply to AC power has conventionally been known as one kind of semiconductor devices.

Such a semiconductor module is used to convert a DC voltage to a three-phase AC voltage to drive a three-phase motor, for example (JP 6062565 B).

In the conventional semiconductor module (FIGS. 3 and 4), central wiring lines are disposed between a power supply line and a ground line, on which low side switches are arranged in a longitudinal direction of the semiconductor module. There is a linear gap between facing side surfaces of adjacent central wiring lines, the linear gap extending in a lateral direction of the semiconductor module.

Due to the existence of the linear gaps, the wiring lines of the semiconductor module may be warped in the longitudinal direction. Furthermore, water may easily enter the semiconductor module since the path of the water from the space between the sealing member and the respective terminals and the substrate to the inside of the semiconductor module may be shortened due to the existence of the linear gaps.

DISCLOSURE OF THE INVENTION

Problem to Be Solved By the Invention

Under the circumstance, it is an object of the present invention to provide a semiconductor module capable of preventing the warp of the wiring lines, and preventing water from entering the inside of the semiconductor module.

Solution to Problem

A semiconductor module configured to convert a direct current to a three-phase alternating current, and to supply the three-phase alternating current to a three-phase motor to drive the three-phase motor, the semiconductor module comprising:

a substrate;

a power supply line disposed along a first side on the substrate;

a power supply terminal connected to the power supply line;

a first ground line, a second ground line, and a third ground line disposed on the substrate along a second side that faces the first side of the substrate;

a first ground terminal connected to the first ground line, a second ground terminal connected to the second ground line, and a third ground terminal connected to the third ground line;

first to third motor terminals connected to coils of the three-phase motor;

first to third half bridges each of which includes a high side switch and a low side switch connected in series between the power supply line and a corresponding one of the first to the third ground lines, a junction point of the high side switch and the low side switch being connected to a corresponding one of the first to the third motor terminals, and the junction points of the first to third half bridges being connected in parallel with one another;

first to sixth control signal terminals, to which control signals for controlling operations of the high side switches and the low side switches of the first to the third half bridges are inputted;

first to third central wiring lines disposed on a top surface of the substrate between the power supply line and the first to the third ground lines; and a sealing member for sealing, at least on the substrate, the power supply line, the first to the ground lines, the first to the third central wiring lines, and the first to the third half bridges, wherein a first gap between side surfaces of the first and the second central wiring lines, which side surfaces are close to each other and face each other, and a second gap between side surfaces of the second and the third central wiring lines, which side surfaces are close to each other and face each other, are bent on the top surface of the substrate.

In the semiconductor module, wherein the first gap and the second gap are bent stepwise on the top surface of the substrate.

In the semiconductor module, wherein the first gap is bent so that a protruding portion of a side surface of the first central wiring line fits a recessed portion of a side surface of the second central wiring line on the top surface of the substrate, and wherein the second gap is bent so that a protruding portion of another side surface of the second central wiring line fits a recessed portion of a side surface of the third central wiring line on the top surface of the substrate.

In the semiconductor module, wherein the first central wiring line is disposed between the one end of the power supply line and the first ground line on the top surface of the substrate, and electrically connected to another end of the first high side switch and the first motor terminal, and the first low side switch is disposed on a top surface of the first central wiring line, wherein the third central wiring line is disposed between another end of the power supply line and the third ground line on the top surface of the substrate, and electrically connected to another end of the third high side switch and the third motor terminal, and the third low side switch is disposed on a top surface of the third central wiring line, and wherein the second central wiring line is disposed between the power supply line and the second ground line and between the first central wiring line and the third central wiring line on the top surface of the substrate, and electrically connected to another end of the second high side switch and the second motor terminal, and the second low side switch is disposed on a top surface of the second central wiring line.

In the semiconductor module, wherein an area of each of the first to the third ground line is smaller than an area of the power supply line.

In the semiconductor module, wherein one end of the first ground terminal is connected to one end of the first ground line that is in the vicinity of a third side of the substrate, which intersects with the first side and the second side, wherein one end the second ground terminal is connected to one end of the second ground line in the vicinity of the second side, and wherein one end of the third ground terminal is connected to one end of the third ground line in the vicinity of a fourth side that faces the third side of the substrate.

In the semiconductor module, the semiconductor module further comprising a thermistor disposed between the first ground line and the second ground line or between the second ground line and the third ground line on the substrate, in the vicinity of the second side of the substrate, to detect a temperature.

In the semiconductor module, wherein an area of each of the first to the third ground line is smaller than an area of the power supply line.

In the semiconductor module, wherein the power supply terminal is disposed so as not to cover the first support dummy line, wherein the third motor terminal is disposed so as not to cover the second support dummy line, wherein the first ground terminal is disposed so as not to cover the third support dummy line, and wherein the third ground terminal is disposed so as not to cover the fourth support dummy line.

In the semiconductor module, wherein the first to the third control signal terminals are arranged in a direction along which the first side extends so that one ends of the first to the third control signal terminals are in the vicinity of the first side of the substrate, and wherein the fourth to the sixth control signal terminals are arranged in a direction along which the second side extends so that one ends of the fourth to the sixth control signal terminals are in the vicinity of the second side of the substrate.

In the semiconductor module, wherein the first control signal terminal is disposed between the power supply terminal and the first motor terminal, wherein the second control signal terminal is disposed between the first motor terminal and the second motor terminal, and wherein the third control signal terminal is disposed between the second motor terminal and the third motor terminal.

In the semiconductor module, wherein the fourth control signal terminal is disposed between the first ground terminal and the second ground terminal, and wherein the fifth and the sixth control signal terminals are disposed between the second ground terminal and the third ground terminal.

In the semiconductor module, wherein other ends of the first to the third control signal terminals, which are connected to a mounting substrate, are disposed to be closer to the first side of the substrate than another end of the power supply terminal and other ends of the first to the third motor terminals connected to the mounting substrate, and wherein other ends of the fourth to the sixth control signal terminals, which are connected to the mounting substrate, are disposed to be close to the second side of the substrate than other ends of the first to the third ground terminals connected to the mounting substrate.

In the semiconductor module, wherein the first half bridge includes a first high side switch disposed on one end of the power supply line, a first electrode of the first high side switch being electrically connected to the power supply line, wherein the third half bridge includes a third high side switch disposed on another end of the power supply line, a first electrode of the first high side switch being electrically connected to the power supply line, and wherein the second half bridge has a second high side switch disposed on the power supply line between the first high side switch and the third high side switch, a first electrode of the second high side switch being electrically connected to the power supply line.

In the semiconductor module, the semiconductor module further comprising:

a first central wiring line disposed on a top surface of the substrate between the one end of the power supply line and the first ground line, and electrically connected to another end of the first high side switch and the first motor terminal, the first low side switch being disposed on a top surface of the first central wiring line;

a third central wiring line disposed on the top surface of the substrate between the other end of the power supply line and the third ground line, and electrically connected to another end of the third high side switch and the third motor terminal, the third low side switch being disposed on a top surface of the third central wiring line; and a second central wiring line disposed on the top surface of the substrate between the power supply line and the second ground line and between the first central wiring line and the third central wiring line, and electrically connected to another end of the second high side switch and the second motor terminal, the second low side switch being disposed on a top surface of the second central wiring line.

Effects of the Invention

The semiconductor module according to an aspect of the present invention includes the substrate, the power supply line disposed along the first side of the substrate, the power supply terminal Vin connected to the power supply line, the first ground line, the second ground line, and the third ground line disposed on the substrate along the second side facing the first side of the substrate, the first ground terminal connected to the first ground line, the second ground terminal connected to the second ground line, the third ground terminal connected to the third ground line, the first to the third motor terminals connected to the coils of the three-phase motor, the first to the third half bridges, in each of which the high side switch and the low side switch are connected in series between the power supply line and the corresponding one of the first to the third ground lines, and the junction point of the high side switch and the low side switch is connected to the corresponding one of the first to the third motor terminals, the junction points of the first to the third half bridges being connected in parallel to one another, the first to sixth control signal terminals to which control signals for controlling the operations of the high side switches and the low side switches of the first to the third half bridges are inputted, the first to the third central wiring lines disposed on the top surface of the substrate between the power supply line and the first to the third ground lines, and the sealing member for sealing, at least on the substrate, the power supply line, the first to the third ground lines, the first to the third central wiring lines, and the first to the third half bridges.

The first gap between the side surface of the first central wiring line and the side surface of the second central wiring line, and the second gap between the other side surface of the second central wiring line and a side surface of the third central wiring line are bent on the top surface of the substrate.

Therefore, the semiconductor module according to the present invention may prevent the warp of the wiring lines and prevent water from entering the inside of the semiconductor module.

EMBODIMENTS FOR CARRYING OUT THE INVENTION

Embodiments of the present invention will now be described with reference to the accompanying drawings.

First Embodiment

A semiconductor module 100 according to a first embodiment is, for example, an inverter device for converting a direct current to a three-phase alternating current, which is supplied to a three-phase motor to drive the three-phase motor.

Figure 1:
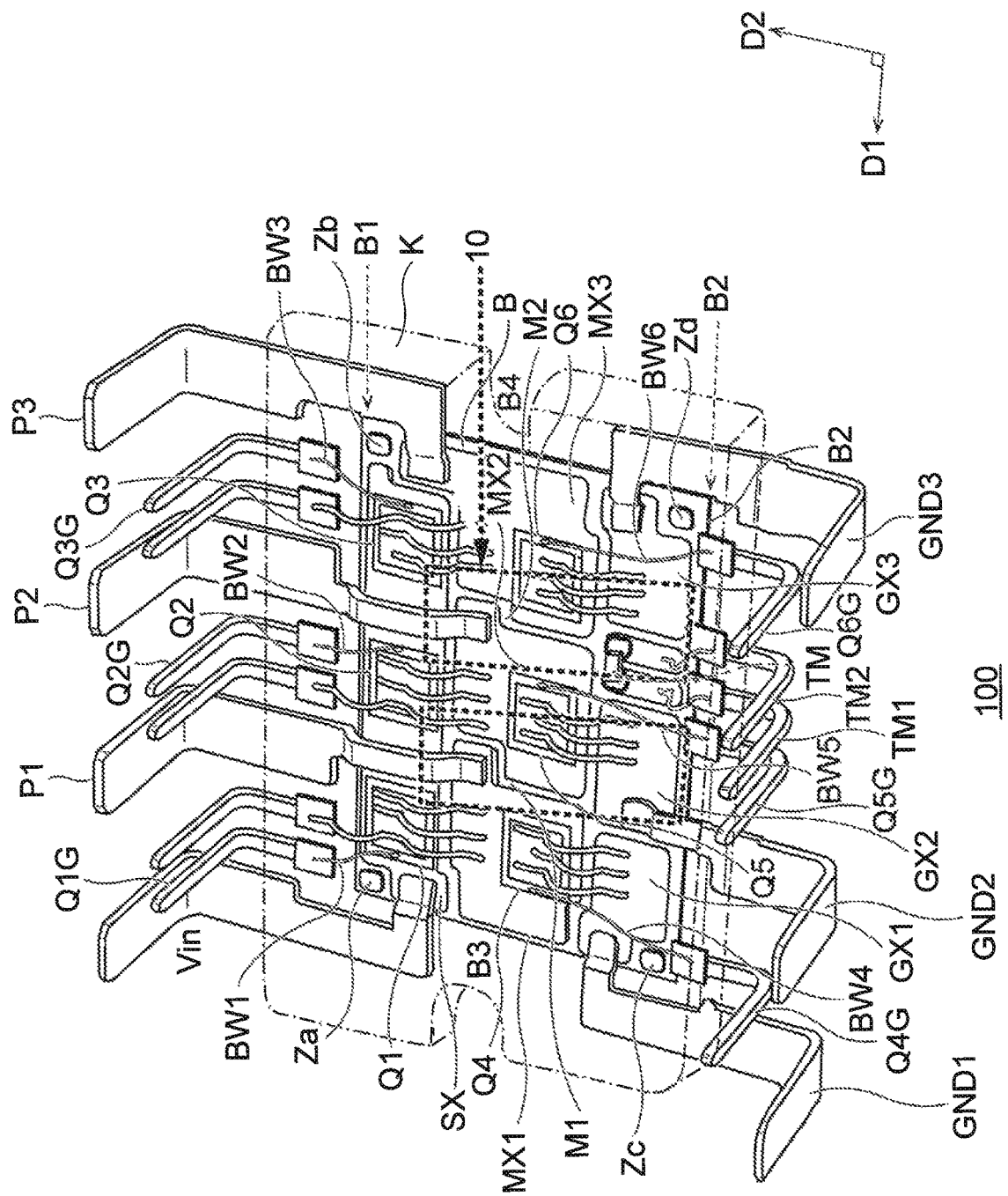
FIG. 1 is a diagram illustrating an example of a structure of a semiconductor module 100 according to a first embodiment.
Figure 2:
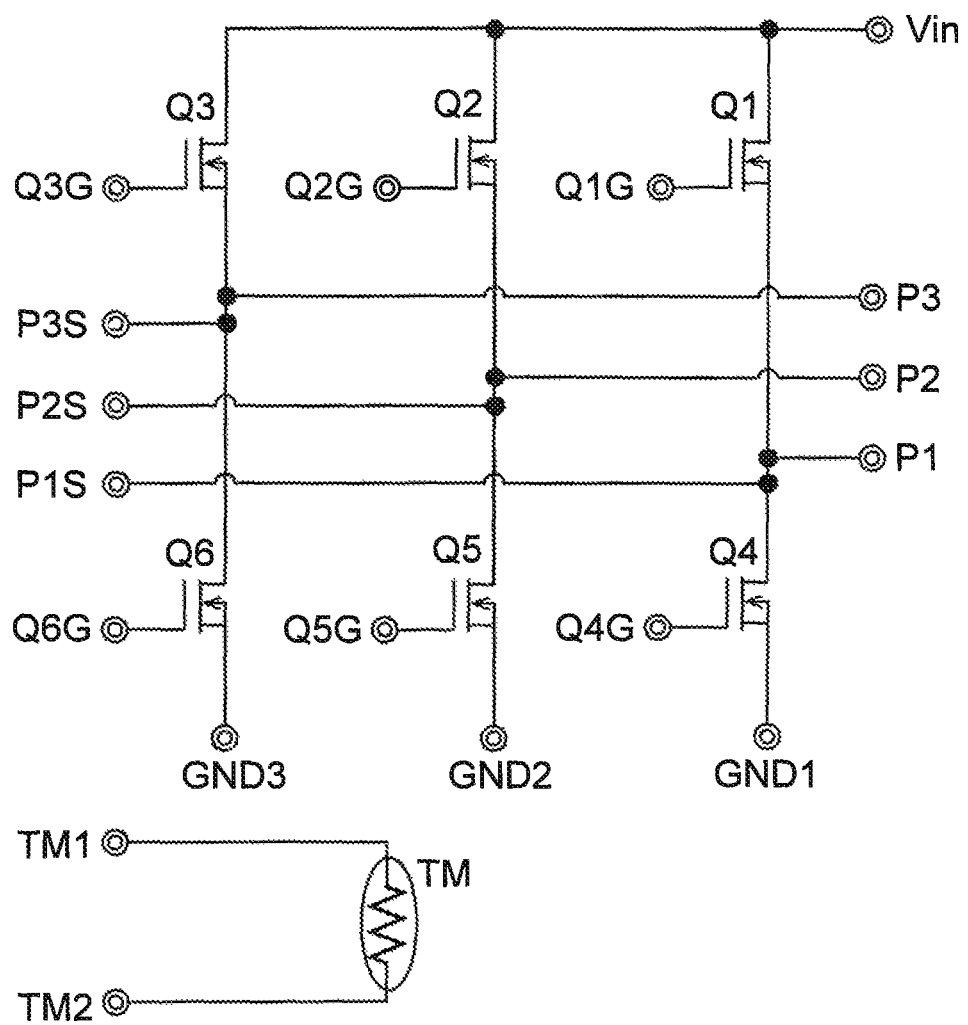
FIG. 2 is a circuit diagram illustrating an example of a circuit configuration of the semiconductor module 100 shown in FIG. 1.
Figure 3:
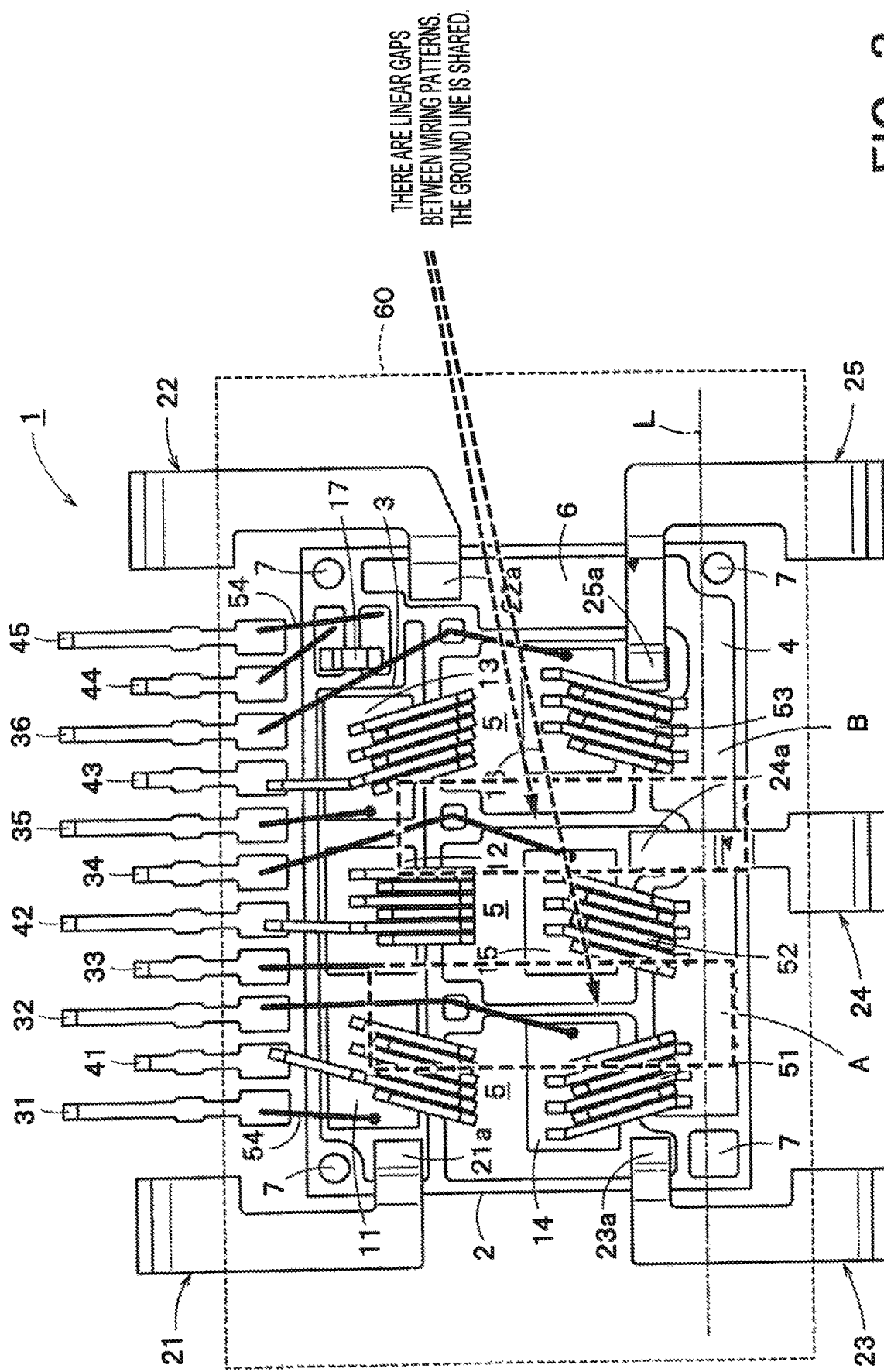
FIG. 3 is a diagram illustrating an example of a structure of a conventional semiconductor module.
Figure 4:
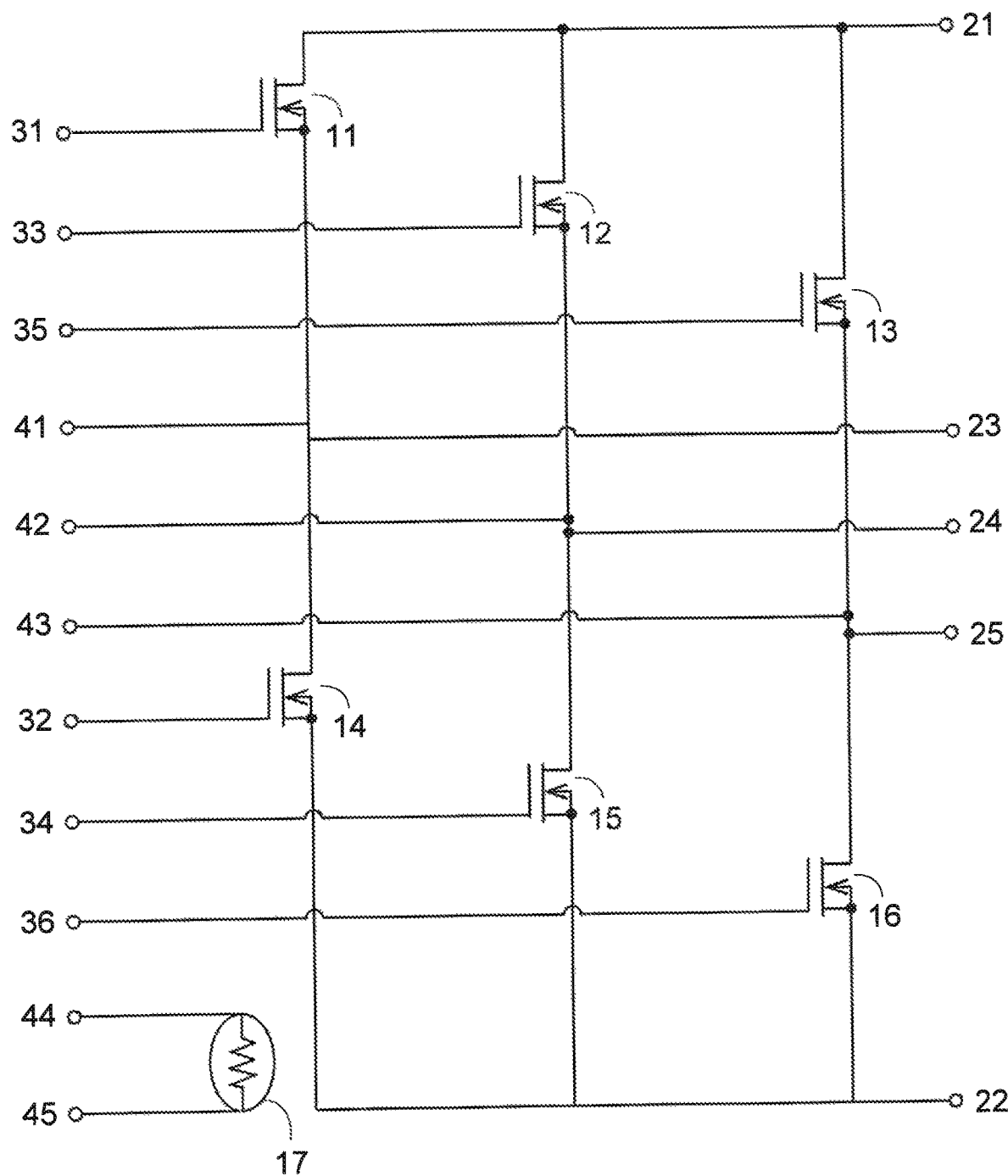
FIG. 4 is a circuit diagram illustrating an example of a circuit configuration of the conventional semiconductor module shown in FIG. 3.

As shown in FIGS. 1 and 2, for example, the semiconductor module 100 includes a substrate B, a power supply line SX, a power supply terminal Vin, a first ground line GX1, a second ground line GX2, a third ground line GX3, a first ground terminal GND1, a second ground terminal GND2, a third ground terminal GND3, a first motor terminal P1, a second motor terminal P2, a third motor terminal P3, a first half bridge (Q1, Q4), a second half bridge (Q2, Q5), a third half bridge (Q3, Q6), first to sixth control signal terminals Q1G to Q6G, first to sixth control bonding wires BW1 to BW6, a thermistor TM, a first temperature detection signal terminal TM1, a second temperature detection signal terminal TM2, a first support dummy line Za, a second support dummy line Zb, a third support dummy line Zc, a fourth support dummy line Zd, a first central wiring line MX1, a second central wiring line MX2, a third central wiring line MX3, and a sealing member K.

The substrate B is an insulated substrate such as a ceramic substrate.

The substrate B has a rectangular shape. The length of a first side B1 and the length of a second side B2 that faces the first side B1 is the same in the substrate B. The length of a third side B3 and the length of a fourth side B4 that faces the third side B3 are the same in the substrate B. The length of the first side B1 is longer than the length of the third side B3.

A first direction D1 in which the first side B1 of the substrate B extends and a second direction D2 in which the third side B3 of the substrate B extends are perpendicular to each other.

The power supply line SX is disposed to extend along the first side B1 on the substrate B.

The power supply terminal Vin is connected to the power supply line SX. A DC power supply voltage is applied to the power supply terminal Vin.

The first ground line GX1, the second ground line GX2, and the third ground line GX3 are arranged on the substrate B along the second side B2 that faces the first side B1 of the substrate B.

The first ground line GX1 is connected to a second electrode (source) of a first low side switch Q4 via a bonding wire.

The second ground line GX2 is connected to a second electrode (source) of a second low side switch Q5 via a bonding wire.

The third ground line GX3 is connected to a second electrode (source) of a third low side switch Q6 via a bonding wire.

The first ground terminal GND1 is connected to the first ground line GX1, for example, as shown in FIG. 1. The first ground terminal GND1 is grounded.

One end of the first ground terminal GND1 is connected to one end of the first ground line GX1 that is in the vicinity of the third side B3 of the substrate B, the third side B3 crossing the first and the second sides B1 and B2.

The second ground terminal GND2 is connected to the second ground line GX2, for example, as shown in FIG. 1. The second ground terminal GND2 is grounded.

One end of the second ground terminal GND2 is connected to one end of the second ground line GX2 that is in the vicinity of the second side B2.

The third ground terminal GND3 is connected to the third ground line GX3, for example, as shown in FIG. 1. The third ground terminal GND3 is grounded.

One end of the third ground terminal GND3 is connected to one end of the third ground line GX3 that is in the vicinity of the fourth side B4 facing the third side B3 of the substrate B.

The area of each of the first to the third ground lines GND1, GND2, and GND3 is set to be smaller than the area of the power supply line SX.

The first ground terminal GND1, the second ground terminal GND2, and the third ground terminal GND3 are arranged along the second side B2 of the substrate B as shown in FIG. 1, for example, and electrically insulated from one another (region 10 in FIG. 1).

The first to the third motor terminals P1, P2, and P3 are connected to a U phase coil, a V phase coil, and a W phase coil of a three-phase motor (not shown), respectively.

More specifically, the first motor terminal P1 is connected to a first phase (U phase) coil of the three-phase motor. The second motor terminal P2 is connected to a second phase (V phase) coil of the three-phase motor. The third motor terminal P3 is connected to a third phase (W phase) coil of the three-phase motor.

The first half bridge (Q1, Q4) includes, for example, a first high side switch Q1 and a first low side switch Q4, as shown in FIGS. 1 and 2, for example.

The first high side switch Q1 has one end that is electrically connected to one end of the power supply terminal Vin, and the other end that is connected to one end of the first motor terminal P1.

The first low side switch Q4 has one end that is electrically connected to the one end of the first motor terminal P1, and the other end that is electrically connected to the first ground line GX1.

As shown in FIG. 1, for example, the first high side switch Q1 of the first half bridge (Q1, Q4) is disposed on the one end of the power supply line SX. The first high side switch Q1 has a first electrode (drain) that is electrically connected to the power supply line SX.

As shown in FIG. 1, for example, a control electrode (gate) of the first high side switch Q1 is electrically connected to the first control signal terminal Q1G with the first control bonding wire BW1.

Thus, the first control bonding wire BW1 connects the control electrode (gate) of the first high side switch Q1 included in the first half bridge (Q1, Q4) and the first control signal terminal Q1G.

The fourth control bonding wire BW4 connects a control electrode (gate) of the first low side switch Q4 included in the first half bridge (Q1, Q4) and the fourth control signal terminal Q4G.

As shown in FIG. 1, for example, the control electrode (gate) of the first low side switch Q4 included in the first half bridge (Q1, Q4) is electrically connected to the fourth control signal terminal Q4G with the fourth control bonding wire BW4, which is arranged to extend over the first ground line GX1.

As shown in FIGS. 1 and 2, for example, the second half bridge (Q2, Q5) includes a second high side switch Q2 and a second low side switch Q5.

The second high side switch Q2 has one end that is electrically connected between the one end and the other end of the power supply terminal SX, and another end that is electrically connected to one end of the second motor terminal P2.

The second low side switch Q5 has one end that is electrically connected to the one end of the second motor terminal P2, and another end that is electrically connected to the second ground line GX2.

As shown in FIG. 1 for example, the second high side switch Q2 included in the second half bridge (Q2, Q5) is disposed on the power supply line SX between the first high side switch Q1 and the third high side switch Q3. The second high side switch Q2 has a first electrode (drain) that is electrically connected to the power supply line SX.

As shown in FIG. 1, for example, a control electrode (gate) of the second high side switch Q2 and the second control signal terminal Q2G are electrically connected to each other with the second control bonding wire BW2.

Thus, the second control bonding wire BW2 connects a control electrode (gate) of the second high side switch Q2 included in the second half bridge (Q2, Q5) and the second control signal terminal Q2G.

The fifth control bonding wire BW5 connects a control electrode (gate) of the second low side switch Q5 included in the second half bridge (Q2, Q5) and the fifth control signal terminal Q5G.

As shown in FIG. 1, for example, the control electrode (gate) of the second low side switch Q5 included in the second half bridge (Q2, Q5) and the fifth control signal terminal Q5G are connected to each other with the fifth control bonding wire BW5, which extends over the second ground line GX2.

The third half bridge (Q3, Q6) includes a third high side switch Q3 and a third low side switch Q6, as shown in FIGS. 1 and 2, for example.

The third high side switch Q3 has one end that is electrically connected to the other end of the power supply terminal SX, and another end that is electrically connected to one end of the third motor terminal P3.

The third low side switch Q6 has one end that is electrically connected to the other end of the third motor terminal P3, and another end that is electrically connected to the third ground line GX3.

As shown in FIG. 1, for example, the third high side switch Q3 of the third half bridge (Q3, Q6) is disposed on the other end of the power supply line SX. The third high side switch Q3 has a first electrode (drain) that is electrically connected to the power supply line SX.

As shown in FIG. 1, for example, a control electrode (gate) of the third high side switch Q3 and the third control signal terminal Q3G are electrically connected to each other with the third control bonding wire BW3.

Thus, the third control bonding wire BW3 connects the control electrode (gate) of the third low side switch Q3 included in the third half bridge (Q3, Q6) and the third control signal terminal Q3G.

The sixth control bonding wire BW6 connects a control electrode (gate) of the third low side switch Q6 included in the third half bridge (Q3, Q6) and the sixth control signal terminal Q6G.

As shown in FIG. 1, for example, the control electrode (gate) of the third low side switch Q6 included in the third half bridge (Q3, Q6) and the sixth control signal terminal Q6G are connected to each other with the sixth control bonding wire BW6, which extends over the third ground line GX3.

As described above, the first to the third half bridges (Q1, Q4), (Q2, Q5), (Q3, Q6) are configured such that the high side switch Q1 and the low side switch Q4 are connected in series between the power supply line SX and the first ground line GX1, the high side switch Q2 and the low side switch Q5 are connected in series between the power supply line SX and the first ground line GX2, and the high side switch Q3 and the low side switch Q6 are connected in series between the power supply line SX and the first ground line GX3.

In the first to the third half bridges (Q1, Q4), (Q2, Q5), (Q3, Q6), the junction point of the high side switch Q1 and the low side switch Q4 is connected to the first motor terminal P1, the junction point of the high side switch Q2 and the low side switch Q5 is connected to the first motor terminal P2, and the junction point of the high side switch Q3 and the low side switch Q6 is connected to the first motor terminal P3, and the junctions points are connected in parallel to each other.

As shown in FIG. 1, for example, the first central wiring line MX1 is disposed on the top surface of the substrate B between the one end of the power supply line SX and the first ground line GX1.

The first low side switch Q4 is disposed on the top surface of the first central wiring line MX1. The first central wiring line MX1 is electrically connected to another end (source) of the first high side switch Q1 and the first motor terminal P1.

The third central wiring line MX3 is disposed on the top surface of the substrate B between the other end of the power supply line SX and the third ground line GX3, as shown in FIG. 1, for example.

The third low side switch Q6 is disposed on the top surface of the third central wiring line MX3. The third central wiring line MX3 is electrically connected to the other end (source) of the third high side switch Q3 and the third motor terminal P3.

The second central wiring line MX2 is disposed on the top surface of the substrate B between the power supply line SX and the second ground line GX2, and between the first central wiring line MX1 and the third central wiring line MX3, as shown in FIG. 1, for example.

The second low side switch Q5 is disposed on the top surface of the second central wiring line MX2. The second central wiring line MX2 is electrically connected to the other end (source) of the second high side switch Q2 and the second motor terminal P2.

As shown in FIG. 1, for example, a first gap M1 between a side surface of the first central wiring line MX1 and a side surface of the second central wiring line MX2, which side surfaces are close to each other and face each other, is bent on the top surface of the first central wiring line MX1 (therefore not linear in the lateral direction).

The first gap M1 is bent stepwise on the top surface of the substrate B, as shown in FIG. 1, for example.

In particular, the first gap M1 is bent so that a protruding portion of the side surface of the first central wiring line MX1 fits a recessed portion of the side surface of the second central wiring line MX2 on the top surface of the substrate B.

Furthermore, as shown in FIG. 1, for example, a second gap M2 between another side surface of the second central wiring line MX2 and a side surface of the third central wiring line MX3, which side surfaces are close to each other and face each other, is bent on the top surface of the substrate B (therefore not linear in the lateral direction).

The second gap M2 is bent stepwise on the top surface of the substrate B, as shown in FIG. 1, for example.

In particular, the second gap M2 is bent so that a protruding portion of the side surface of the second central wiring line MX2 fits a recessed portion of the side surface of the third central wiring line.

Control signals for controlling the operations of the first to the third high side switches Q1 to Q3 and the first to the third low side switches Q4 to Q6 of the first to the third half bridges (Q1, Q4), (Q2, Q5), (Q3, Q6) are inputted to the first to the sixth control signal terminals (Q1G to Q6G), as shown in FIG. 1, for example.

The first to the third control signal terminals Q1G, Q2G, and Q3G are arranged in the direction along which the first side B1 of the substrate B extends with one end of each control signal terminal being in the vicinity of the first side B1.

The first control signal terminal Q1G is disposed between the power supply terminal Vin and the first motor terminal P1, as shown in FIG. 1, for example.

The second control signal terminal Q2G is disposed between the first motor terminal P1 and the second motor terminal P2 as shown in FIG. 1, for example.

The third control signal terminal Q3G is disposed between the second motor terminal P2 and the third motor terminal P3, as shown in FIG. 1, for example.

The fourth to the sixth control signal terminals Q4, Q5, and Q6 are arranged in the direction along which the second side B2 of the substrate B extends with one end of each control signal terminal being in the vicinity of the second side B2.

As a result, the signal lines for controlling the switches of the high side and the signal lines for controlling the switches of the low side are disposed to different locations (regions 10 in FIG. 1) so that the signal lines for conveying the control signals for controlling the switches may have the same length and have the same signal transmission time, thereby improving the switch controllability.

The fourth control signal terminal Q4G is disposed between the first ground terminal GND1 and the second ground terminal GND2, as shown in FIG. 1, for example.

The fifth and the sixth control signal terminals Q5G and Q6G are disposed between the second ground terminal GND2 and the third ground terminal GND3, as shown in FIG. 1, for example.

The thermistor TM is disposed near the second side B2 on the substrate B between the first ground line GX1 and the second ground line GX2, or between the second ground line GX2 and the third ground line GX3. The thermistor TM is for detecting the ambient temperature.

In the example shown in FIG. 1, the thermistor TM is disposed in the vicinity of the second side B2 of the substrate B between the second ground line GX2 and the third ground line GX3.

The first temperature detection signal terminal TM1 is electrically connected to one end of the thermistor TM, as shown in FIG. 1 for example.

The second temperature detection signal terminal TM2 is electrically connected to the other end of the thermistor TM, as shown in FIG. 1 for example.

The first and the second temperature detection signal terminals TM1 and TM2 are disposed between the fifth control signal terminal Q5G and the sixth control signal terminal Q6G, as shown in FIG. 1 for example.

In the example of FIG. 1, the thermistor TH is disposed between the second ground line GX2 and the third ground line GX3. However, if necessary, the thermistor TH may be disposed in the vicinity of the power supply line SX on the high side where the temperature may change easily.

The first support dummy line Za is disposed on a first corner portion of the substrate B where first side B1 and the third side B3 of the substrate B intersect each other, as shown in FIG. 1 for example.

The power supply terminal Vin described above is disposed so as not to cover the first support dummy line Za, as shown in FIG. 1 for example.

As shown in FIG. 1, for example, the second support dummy line Zb is disposed on a second corner portion of the substrate B where the first side B1 and the fourth side B4 of the substrate B intersect each other.

The third motor terminal P3 described above is disposed so as not to cover the second support dummy line Zb as shown in FIG. 1 for example.

The third support dummy line Zc is disposed on a third corner portion of the substrate B where the second side B2 and the third side B3 of the substrate B intersect each other, as shown in FIG. 1 for example.

The first ground terminal GND1 described above is disposed so as not to cover the third support dummy line Zc as shown in FIG. 1 for example.

The fourth support dummy line Zd is disposed on a fourth corner portion of the substrate B where the second side B2 and the fourth side B4 of the substrate B intersect each other.

The third ground terminal GND3 described above is disposed so as not to cover the fourth support dummy line Zd as shown in FIG. 1 for example.

The top surfaces of the first to the fourth support dummy lines Za to Zd are pressed by a support member (not shown) during a wire bonding process so that the substrate B is pressed by the support member.

The first to the fourth support dummy lines Za to Zd are formed with the same material as the power supply line SX etc. described above.

The other ends of the first to the third control signal terminals Q1G to Q3G connected to a mounting substrate (not shown) are disposed to be closer to the first side B1 of the substrate B than the other end of the power supply terminal Vin and the other ends of the first to the third motor terminals P1 to P3 connected to the mounting substrate.

The other ends of the fourth to the sixth control signal terminals Q4G to Q6G connected to the mounting substrate are disposed to be closer to the second side B2 of the substrate B than the other ends of the first to the third ground terminals PGND1 to GND3 connected to the mounting substrate.

As a result, when the electronic module 100 is disposed in the vicinity of a CPU mounted on the mounting substrate, the other ends of the first to the third control signal terminals Q1G to Q3G and the fourth to the sixth control signal terminals Q4G to Q6G may be connected to the mounting substrate so as to be close to the CPU. Therefore, the lengths of the wiring lines from the CPU to the other ends of the first to the third control signal terminals Q1G to Q3G and to the other ends of the fourth to the sixth control signal terminals Q4G to Q6G may be shortened.

Furthermore, the other end of the power supply terminal Vin, the other ends of the first to the third motor terminals P1 to P3, and the other ends of the first to the third ground terminals PGND1 to GND3, through which a large current may flow, may be disposed to be at a distance from the CPU.

The sealing member K is formed of a sealing resin such as an epoxy resin. In FIG. 1, the sealing member K is illustrated to be transparent.

As shown in FIG. 1, for example, the sealing member K seals, at least on the substrate B, the power supply line SX, the power supply terminal Vin, the first ground line GX1, the second ground line GX2, the third ground line GX3, first to third output lines LMU, LMV, and LMW, the first to the third central wiring lines LYU, LYV, and LYW, a first current detection wiring line LC1, a second current detection wiring line LC2, a connection wiring line LR1, a first thermistor wiring line LT1, a second thermistor wiring line LT2, a first capacitor C1, a second capacitor C2, a resistor R1, the first half bridge (Q1, Q4), the second half bridge (Q2, Q5), the third half bridge (Q3, Q6), the thermistor TM, the first support dummy line Za, the second support dummy line Zb, the third support dummy line Zc, the fourth support dummy line Zd, the first central wiring line MX1, the second central wiring line MX2, the third central wiring line MX3, the first to the sixth control bonding wires BW1 to BW6, and other bonding wires.

Furthermore, the sealing member K seals the one ends of the power supply terminal Vin, the first motor terminal P1, the second motor terminal P2, the third motor terminal P3, the first control signal terminal Q1G, the second control signal terminal Q2G, and the third control signal terminal Q3G along the first side B1 of the substrate B, as shown in FIG. 1, for example.

The sealing member K further seals the one ends of the first ground terminal GND1, the second ground terminal GND2, the third ground terminal GND3, the first temperature detection signal terminal TM1, the second temperature detection signal terminal TM2, the fourth control signal terminal Q4G, the fifth control signal terminal Q5G, and the sixth control signal terminal Q6G along the second side B2 of the substrate B, as shown in FIG. 1, for example.

As described above, the first ground line GX1, the second ground line GX2, and the third ground line GX3 of the semiconductor module 100 are disposed along the second side B2 that faces the first side B1 of the substrate B as shown in FIG. 1. The first ground terminal GND1 is connected to the first ground line GX1, the second ground terminal GND2 is connected to the second ground line GX2, and the third ground terminal GND3 is connected to the third ground line GX3. The first ground terminal GND1, the second ground terminal GND2, and the third ground terminal GND3 are arranged along the second side B2 to be separated from one another and electrically isolated from one another.

Since the first to the third ground terminals GND1, GND2, and GND3, which are lead terminals, do not extend over the first to the third ground lines GX1, GX2, and GX3, the influence among the wiring lines such as the inductance may be reduced, thereby reducing the noise.

Therefore, in the semiconductor module 100 according to the first embodiment, the inductance of each ground line may be reduced, and the switching noise of the switches of the half bridges included in the semiconductor module may be reduced.

Since the first to the third ground terminals GND1, GND2, and GND3, which are lead terminals, do not extend over the first to third ground lines GX1, GX2, and GX3, the influence among the wiring lines such as the inductance may be reduced, thereby reducing the noise.

Furthermore, as described above, the first to the third control signal terminals Q1G, Q2G, and Q3G are arranged in the direction along which the first side B1 of the substrate B extends so that the one ends thereof are in the vicinity of the first side B1, and the fourth to the sixth control signal terminals Q4, Q5, and Q6 are arranged in the direction along which the second side B2 of the substrate B so that the one ends thereof are in the vicinity of the second side B2.

Therefore, in the semiconductor module 100 according to the first embodiment 1, the signal lines for controlling the switches of the high side and the signal lines for controlling the switches of the low side are disposed to different locations so that the signal lines for conveying the control signals for controlling the switches may have the same length and have the same signal transmission time, thereby improving the switch controllability.

Second Embodiment

In the first embodiment described above, the first to the third high side switches Q1, Q2, and Q3 and the first to the third low side switches Q4, Q5, and Q6 are nMOSFETs (FIG. 2). However, other semiconductor devices may be used.

In other words, the first to the third high side switches Q1, Q2, and Q3 and the first to the third low side switches Q4, Q5, and Q6 may be pMOSFETs or other semiconductor devices as long as the same functions are achieved.

The configuration of the semiconductor module according to the second embodiment is the same as that of the first embodiment except for the above point.

As described above, the semiconductor module 100 according to an aspect of the present invention includes the substrate B, the power supply line SX disposed along the first side B1 of the substrate, the power supply terminal Vin connected to the power supply line, the first ground line GX1, the second ground line GX2, and the third ground line GX3 disposed on the substrate along the second side B2 facing the first side B1 of the substrate, the first ground terminal GND1 connected to the first ground line GX1, the second ground terminal GND2 connected to the second ground line GX2, the third ground terminal GND3 connected to the third ground line GX3, the first to the third motor terminals (P1, P2, P3) connected to the coils of the three-phase motor, the first to the third half bridges (Q1, Q4), (Q2, Q5), (Q3, Q6), in each of which the high side switch and the low side switch are connected in series between the power supply line and the corresponding one of the first to the third ground lines, and the junction point of the high side switch and the low side switch is connected to the corresponding one of the first to the third motor terminals, the junction points of the first to the third half bridges being connected in parallel to one another, the first to sixth control signal terminals (Q1G to Q6G) to which control signals for controlling the operations of the high side switches and the low side switches of the first to the third half bridges are inputted, the first to the third central wiring lines MX1 to MX3 disposed on the top surface of the substrate between the power supply line SX and the first to the third ground lines GX1 to GX3, and the sealing member K for sealing, at least on the substrate, the power supply line, the first to the third ground lines, the first to the third central wiring lines, and the first to the third half bridges.

The first gap M1 between the side surface of the first central wiring line and the side surface of the second central wiring line, and the second gap M2 between the other side surface of the second central wiring line and a side surface of the third central wiring line are bent on the top surface of the substrate (therefore not linear in the lateral direction).

Therefore, the semiconductor module according to the present invention may prevent the warp of the wiring lines and prevent water from entering the inside of the semiconductor module.

While certain embodiments have been described, these embodiments have been presented by way of example only, and are not intended to limit the scope of the inventions. The embodiments may be embodied in a variety of other forms. Furthermore, various omissions, substitutions and changes in the form of the methods and systems described herein may be made without departing from the spirit of the inventions. The embodiments and their modifications are included in the scope and the subject matter of the invention, and at the same time included in the scope of the claimed inventions and their equivalents.

Explanation of References

100: semiconductor module
B: substrate
SX: power supply line
Vin: power supply terminal
GX1: first ground line
GX2: second ground line
GX3: third ground line
GND1: first ground terminal
GND2: second ground terminal
GND3: third ground terminal
P1: first motor terminal
P2: second motor terminal
P3: third motor terminal
Q1G: first control signal terminal
Q2G: second control signal terminal
Q3G: third control signal terminal
Q4G: fourth control signal terminal
Q5G: fifth control signal terminal
Q6G: sixth control signal terminal
BW1: first control bonding wire
BW2: second control bonding wire
BW3: third control bonding wire
BW4: fourth control bonding wire
BW5: fifth control bonding wire
BW6: sixth control bonding wire
TM: thermistor
TM1: first temperature detection signal terminal
TM2: second temperature detection signal terminal
Za: first support dummy line
Zb: second support dummy line
Zc: third support dummy line
Zd: fourth support dummy line
MX1: first central wiring line
MX2: second central wiring line
MX3: third central wiring line
K: sealing member
Q1: first high side switch
Q2: second high side switch
Q3: third high side switch
Q4: first low side switch
Q5: second low side switch
Q6: third low side switch

The invention claimed is:

1. A semiconductor module configured to convert a direct current to a three-phase alternating current, and to supply the three-phase alternating current to a three-phase motor to drive the three-phase motor, the semiconductor module comprising:
a substrate;
a power supply line disposed along a first side on a top surface of the substrate;
a power supply terminal connected to the power supply line;
a first ground line, a second ground line, and a third ground line disposed on the top surface of the substrate along a second side that faces the first side of the substrate;
a first ground terminal connected to the first ground line, a second ground terminal connected to the second ground line, and a third ground terminal connected to the third ground line;
first to third motor terminals connected to coils of the three-phase motor;
first to third half bridges each of which includes a high side switch and a low side switch connected in series between the power supply line and a corresponding one of the first to the third ground lines, a junction point of the high side switch and the low side switch being connected to a corresponding one of the first to the third motor terminals, and the junction points of the first to third half bridges being connected in parallel with one another;
first to sixth control signal terminals, to which control signals for controlling operations of the high side switches and the low side switches of the first to the third half bridges are inputted;
first to third central wiring lines disposed on the top surface of the substrate between the power supply line and the first to the third ground lines; and
a sealing member for sealing, at least on the top surface of the substrate, the power supply line, the first to the ground lines, the first to the third central wiring lines, and the first to the third half bridges,
wherein the first low side switch is disposed on a top surface of the first central wiring line,
wherein the second low side switch is disposed on a top surface of the second central wiring line,
wherein the third low side switch is disposed on a top surface of the third central wiring line, and
wherein a first gap between side surfaces of the first and the second central wiring lines, which side surfaces are close to each other and face each other, and a second gap between side surfaces of the second and the third central wiring lines, which side surfaces are close to each other and face each other, are bent on the top surface of the substrate.

2. The semiconductor module according to claim 1, wherein the first gap and the second gap are bent stepwise on the top surface of the substrate.

3. The semiconductor module according to claim 1,
wherein the first gap is bent so that a protruding portion of a side surface of the first central wiring line fits a recessed portion of a side surface of the second central wiring line on the top surface of the substrate, and
wherein the second gap is bent so that a protruding portion of another side surface of the second central wiring line fits a recessed portion of a side surface of the third central wiring line on the top surface of the substrate.

4. The semiconductor module according to claim 1,
wherein the first central wiring line is disposed between the one end of the power supply line and the first ground line on the top surface of the substrate, and electrically connected to another end of the first high side switch and the first motor terminal,
wherein the third central wiring line is disposed between another end of the power supply line and the third ground line on the top surface of the substrate, and electrically connected to another end of the third high side switch and the third motor terminal,
wherein the second central wiring line is disposed between the power supply line and the second ground line and between the first central wiring line and the third central wiring line on the top surface of the substrate, and electrically connected to another end of the second high side switch and the second motor terminal.

5. The semiconductor module according to claim 1, wherein an area of each of the first to the third ground line is smaller than an area of the power supply line.

6. The semiconductor module according to claim 5,
wherein one end of the first ground terminal is connected to one end of the first ground line that is in the vicinity of a third side of the substrate, which intersects with the first side and the second side,
wherein one end the second ground terminal is connected to one end of the second ground line in the vicinity of the second side, and
wherein one end of the third ground terminal is connected to one end of the third ground line in the vicinity of a fourth side that faces the third side of the substrate.

7. The semiconductor module according to claim 1, further comprising a thermistor disposed between the first ground line and the second ground line or between the second ground line and the third ground line on the top surface of the substrate, in the vicinity of the second side of the substrate, to detect a temperature.

8. The semiconductor module according to claim 1, further comprising: a first support dummy line, a second support dummy line, a third support dummy line, and a fourth support dummy line,
wherein the substrate has a third side and a fourth side intersect the first side and the second side of the substrate,
wherein the first support dummy line is disposed on a first corner portion of the substrate where the first side and the third side of the substrate intersect each other,
wherein the second support dummy line is disposed on a second corner portion of the substrate where the first side and the fourth side of the substrate intersect each other,
wherein the third support dummy line is disposed on a third corner portion of the substrate where the second side and the third side of the substrate intersect each other, and
wherein the fourth support dummy line is disposed on a fourth corner portion of the substrate where the second side and the fourth side of the substrate intersect each other.

9. The semiconductor module according to claim 8,
wherein the power supply terminal is disposed so as not to cover the first support dummy line,
wherein the third motor terminal is disposed so as not to cover the second support dummy line,
wherein the first ground terminal is disposed so as not to cover the third support dummy line, and
wherein the third ground terminal is disposed so as not to cover the fourth support dummy line.

10. The semiconductor module according to claim 1,
wherein the first to the third control signal terminals are arranged in a direction along which the first side extends so that one ends of the first to the third control signal terminals are in the vicinity of the first side of the substrate, and
wherein the fourth to the sixth control signal terminals are arranged in a direction along which the second side extends so that one ends of the fourth to the sixth control signal terminals are in the vicinity of the second side of the substrate.

11. The semiconductor module according to claim 10,
wherein the first control signal terminal is disposed between the power supply terminal and the first motor terminal,
wherein the second control signal terminal is disposed between the first motor terminal and the second motor terminal, and
wherein the third control signal terminal is disposed between the second motor terminal and the third motor terminal.

12. The semiconductor module according to claim 11,
wherein the fourth control signal terminal is disposed between the first ground terminal and the second ground terminal, and
wherein the fifth and the sixth control signal terminals are disposed between the second ground terminal and the third ground terminal.

13. The semiconductor module according to claim 12,
wherein other ends of the first to the third control signal terminals, which are connected to a mounting substrate, are disposed to be closer to the first side of the substrate than another end of the power supply terminal and other ends of the first to the third motor terminals connected to the mounting substrate, and
wherein other ends of the fourth to the sixth control signal terminals, which are connected to the mounting substrate, are disposed to be close to the second side of the substrate than other ends of the first to the third ground terminals connected to the mounting substrate.

14. The semiconductor module according to claim 1,
wherein the first half bridge includes a first high side switch disposed on one end of the power supply line, a first electrode of the first high side switch being electrically connected to the power supply line,
wherein the third half bridge includes a third high side switch disposed on another end of the power supply line, a first electrode of the first high side switch being electrically connected to the power supply line, and wherein the second half bridge has a second high side switch disposed on the power supply line between the first high side switch and the third high side switch, a first electrode of the second high side switch being electrically connected to the power supply line.

15. The semiconductor module according to claim 14, further comprising:

a first central wiring line disposed on a top surface of the substrate between the one end of the power supply line and the first ground line, and electrically connected to another end of the first high side switch and the first motor terminal, the first low side switch being disposed on a top surface of the first central wiring line;

a third central wiring line disposed on the top surface of the substrate between the other end of the power supply line and the third ground line, and electrically connected to another end of the third high side switch and the third motor terminal, the third low side switch being disposed on a top surface of the third central wiring line; and a second central wiring line disposed on the top surface of the substrate between the power supply line and the second ground line and between the first central wiring line and the third central wiring line, and electrically connected to another end of the second high side switch and the second motor terminal, the second low side switch being disposed on a top surface of the second central wiring line.

* * * * *